United States Patent
Shi et al.

(10) Patent No.: US 11,862,725 B2
(45) Date of Patent: Jan. 2, 2024

(54) TRANSISTORS WITH SCHOTTKY BARRIERS

(71) Applicant: SKYWORKS SOLUTIONS, INC., Irvine, CA (US)

(72) Inventors: Yun Shi, San Diego, CA (US); John Tzung-Yin Lee, Costa Mesa, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/888,351

(22) Filed: Aug. 15, 2022

(65) Prior Publication Data

US 2023/0038868 A1 Feb. 9, 2023

Related U.S. Application Data (63) Continuation of application No. 16/911,677, filed on Jun. 25, 2020, now Pat. No. 11,417,762.

(60) Provisional application No. 62/866,737, filed on Jun. 26, 2019.

(51) Int. Cl.
| | |
|---|---|
| *H01L 21/02* | (2006.01) |
| *H01L 27/02* | (2006.01) |
| *H01L 29/66* | (2006.01) |
| *H01L 29/78* | (2006.01) |
| *H03K 17/687* | (2006.01) |
| *H03F 3/24* | (2006.01) |

(52) U.S. Cl.
CPC ..... *H01L 29/7839* (2013.01); *H03K 17/6871* (2013.01); *H03F 3/245* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 4,801,983 | A | 1/1989 | Ueno et al. |
| 5,525,829 | A | 6/1996 | Mistry |
| 7,052,945 | B2 | 5/2006 | Snyder |
| 8,003,991 | B2 | 8/2011 | Yatsuo et al. |
| 8,829,614 | B2 | 9/2014 | Guan et al. |
| 8,946,779 | B2 | 2/2015 | Green et al. |
| 9,059,329 | B2 | 6/2015 | Disney |
| 9,177,968 | B1 | 11/2015 | Nygaard |
| 9,576,949 | B2 | 2/2017 | Lee et al. |
| 9,685,345 | B2 | 6/2017 | Green et al. |
| 9,691,756 | B2 | 6/2017 | Kwon |
| 9,741,849 | B1 | 8/2017 | Lee et al. |
| 9,786,740 | B2 | 10/2017 | Shimizu et al. |

(Continued)

OTHER PUBLICATIONS

Final Rejection for U.S. Appl. No. 16/911,677, dated Sep. 22, 2021, 15 pages.

(Continued)

*Primary Examiner* — Kenneth B Wells
(74) *Attorney, Agent, or Firm* — Chang & Hale LLP (57) ABSTRACT

Circuits, systems, devices, and methods related to transistors with Schottky barriers are discussed herein. For example, a method of fabricating a transistor can include forming a p-well or an n-well in a substrate and forming a gate for the transistor. The method can also include doping a region within the p-well or n-well with a concentration below a threshold and forming a conductor layer on the doped region.

20 Claims, 9 Drawing Sheets

(56) References Cited

U.S. PATENT DOCUMENTS

| | | |
|---|---|---|
| 9,824,928 B2 | 11/2017 | Wang et al. |
| 9,825,126 B2 | 11/2017 | Hatta et al. |
| 9,941,273 B2 | 4/2018 | Soeno |
| 10,499,475 B2 | 12/2019 | Tung et al. |
| 10,643,987 B2 | 5/2020 | Lee et al. |
| 10,714,580 B2 | 7/2020 | Lui |
| 10,861,965 B2 | 12/2020 | Deng |
| 11,417,762 B2 * | 8/2022 | Shi .................... H03K 17/6871 |

OTHER PUBLICATIONS

Non-Final Rejection for U.S. Appl. No. 16/911,677, dated Jun. 14, 2021, 15 pages.
Notice of Allowance for U.S. Appl. No. 16/911,677, dated Apr. 13, 2022, 6 pages.

* cited by examiner

TRANSISTORS WITH SCHOTTKY BARRIERS

CROSS-REFERENCE TO RELATED APPLICATIONS

This application is a continuation of U.S. application Ser. No. 16/911,677 (issued as U.S. Pat. No. 11,417,762), filed Jun. 25, 2020 and entitled "Switch with Integrated Schottky Barrier Contact," which claims priority to U.S. Provisional Application No. 62/866,737, filed Jun. 26, 2019 and entitled "Switch with Integrated Schottky Barrier Contact," the entire contents of both are incorporated herein by reference.

BACKGROUND

Field

The present disclosure relates to switches.

Description of the Related Art

Communication devices often operate over a number of different communication bands and/or modes. To do so, the communication devices typically use one or more instances of transmit/receive circuitry to generate and amplify transmit signals and/or to amplify and process receive signals. The transmit/receive circuitry are connected to one or more antennas through switching circuitry, such as transistor switches. Even in cases where different antennas are used, multiple signals of different frequencies may nonetheless have a common signal path and pass through common switching circuitry at some location on a device.

SUMMARY

In accordance with some implementations, the present disclosure relates to a radio-frequency switch comprising an input node, an output node, and a transistor connected between the input node and the output node. The transistor is configured to control passage of a radio-frequency signal from the input node to the output node. The transistor includes a first Schottky diode integrated into a drain of the transistor and a second Schottky diode integrated into a source of the transistor. At least one of the first Schottky diode or the second Schottky diode is configured to compensate a non-linearity effect of the radio-frequency switch.

In some embodiments, at least one of the first Schottky diode or the second Schottky diode is configured to compensate for third order distortion. In some embodiments, the transistor is implemented as a Silicon-on-Insulator (SOI) device. In some embodiments, the first Schottky diode is integrated into the drain and the second Schottky diode is integrated into the source at a substrate level.

In some embodiments, the first Schottky diode includes a first semiconductor region and a first contact disposed on the first region. The first semiconductor region can be doped with a concentration below a threshold and the first contact can be coupled to at least one of the input node or the output node. The second Schottky diode can include a second semiconductor region and a second contact can be disposed on the second semiconductor region. The second semiconductor region can be doped below the threshold and the second contact can be coupled to at least one of the input node or the output node.

In accordance with some implementations, the present disclosure relates to a radio-frequency switch comprising an input node, an output node, and a signal path connected between the input node and the output node. The signal path includes at least one transistor having a Schottky barrier integrated into at least one of a drain or a source of the at least one transistor.

In some embodiments, the Schottky barrier is configured to minimize third order distortion of the radio-frequency switch. The at least one transistor can be implemented as a Silicon-on-Insulator (SOI) device.

In some embodiments, the Schottky barrier includes a first semiconductor region and a first contact disposed on the first region. The first semiconductor region can be doped with a concentration below a threshold and the first contact can coupled to at least one of the input node or the output node. The concentration can be classified as low doping. The concentration can be less than a doping concentration associated with an ohmic contact.

In some embodiments, the Schottky barrier is integrated into the drain of the at least one transistor and the at least one transistor includes another Schottky barrier integrated into the source of the at least one transistor. In some embodiments, the Schottky barrier is integrated into at least one of the source or the drain of the at least one transistor at a substrate level.

In accordance with some implementations, the present disclosure relates to a radio-frequency module comprising a packaging substrate to receive a plurality of components, and a semiconductor die mounted on the packaging substrate. The semiconductor die can include any of the radio-frequency switches discussed herein.

In accordance with some implementations, the present disclosure relates to a radio-frequency device comprising a transceiver configured to generate a radio-frequency signal, a power amplifier connected to the transceiver and configured to generate an amplified radio-frequency signal, and any of the radio-frequency switches discussed herein. The radio-frequency switch can be connected to the power amplifier. The radio-frequency switch can be configured to selectively route the amplified radio-frequency signal.

In accordance with some implementations, the present disclosure relates to a method of fabricating a transistor. The method comprises forming a p-well or n-well in a substrate, forming a gate for the transistor, and forming a Schottky barrier for at least one of a source of the transistor or a drain of the transistor by doping a region within the p-well or n-well with a concentration below a threshold and forming a conductor layer on the doped region.

In some embodiments, the doping the region within the p-well or the n-well with the concentration that is below the threshold includes doping the region with a concentration that is classified as low doping. Further, in some embodiments, the doping the region within the p-well or the n-well with the concentration that is below the threshold includes doping the region with a concentration that is less than a doping concentration associated with an ohmic contact. In some embodiments, the method further comprises forming an insulator layer on the semiconductor substrate to form the transistor as a Silicon-on-Insulator (SOI) device.

In accordance with some implementations, the present disclosure relates to a radio-frequency module comprising a packaging substrate to receive a plurality of components, and a semiconductor die mounted on the packaging substrate. The semiconductor die can include a radio-frequency switch and a biasing circuit. The radio-frequency switch can have at least one transistor with a Schottky barrier integrated into at least one of a drain or a source of the at least one transistor. The biasing circuit can be connected to a gate of the at least one transistor and configured to control passage of a radio-frequency signal through the at least one transistor.

In accordance with some implementations, the present disclosure relates to a radio-frequency device comprising a transceiver configured to generate a radio-frequency signal, a power amplifier connected to the transceiver and configured to generate an amplified radio-frequency signal, a switch connected to the power amplifier and configured to selectively route the amplified radio-frequency signal, and an antenna connected to the switch and configured to transmit the amplified radio-frequency signal. The switch can have at least one transistor with a Schottky barrier integrated into at least one of a drain or a source of the at least one transistor.

In accordance with some implementations, the present disclosure relates to a transistor including a first Schottky diode integrated into a drain of the transistor and/or a second Schottky diode integrated into a source of the transistor.

For purposes of summarizing the disclosure, certain aspects, advantages, and/or features of the disclosure have been described. It is to be understood that not necessarily all such advantages may be achieved in accordance with any particular embodiment of the disclosure. Thus, the disclosure may be embodied or carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes and should in no way be interpreted as limiting the scope of the disclosure. In addition, various features of different disclosed embodiments can be combined to form additional embodiments, which are part of this disclosure. Throughout the drawings, reference numbers may be reused to indicate correspondence between reference elements.

DETAILED DESCRIPTION

Non-linearities in circuitry may cause harmonic distortion and/or intermodulation distortion that make it a challenge to maintain isolation between multiple signals. Third-order intermodulation distortion (IMD3) is the measure of the third-order distortion products produced by a non-linear device when multiple signals closely spaced in frequency are fed into the device as input. At least some of these distortion products are usually so close to the original (desired) frequencies that it is difficult to filter out the distortion product, and thus creates interference challenges in multichannel communication equipment.

This disclosure is directed to, in part, a switching circuit that includes one or more Schottky barrier contacts integrated into a transistor. For example, a switch can include an input node, an output node, and a transistor connected between the input node and the output node. The transistor can control passage of a radio-frequency signal from the input node to the output node. The transistor can include a Schottky barrier contact integrated into a drain of the transistor and/or a Schottky barrier contact integrated into a source of the transistor. A Schottky barrier contact can be integrated at a substrate level into one or more layers of the transistor composition. Each Schottky barrier contact can compensate for a non-linearity effect of other elements of the transistor or switch, resulting in a substantially linear switch. As such, the switch can minimize harmonic and/or intermodulation distortion, such as third-order intermodulation distortion, third-order harmonics, and so on. Further, in examples, integrating a Schottky barrier contact into a transistor at a substrate level can avoid adding other elements to a switch at a circuit level (e.g., a distorter arm, auxiliary arm, etc.) to compensate for a non-linearity effect of components of the switch.

Figure 1:
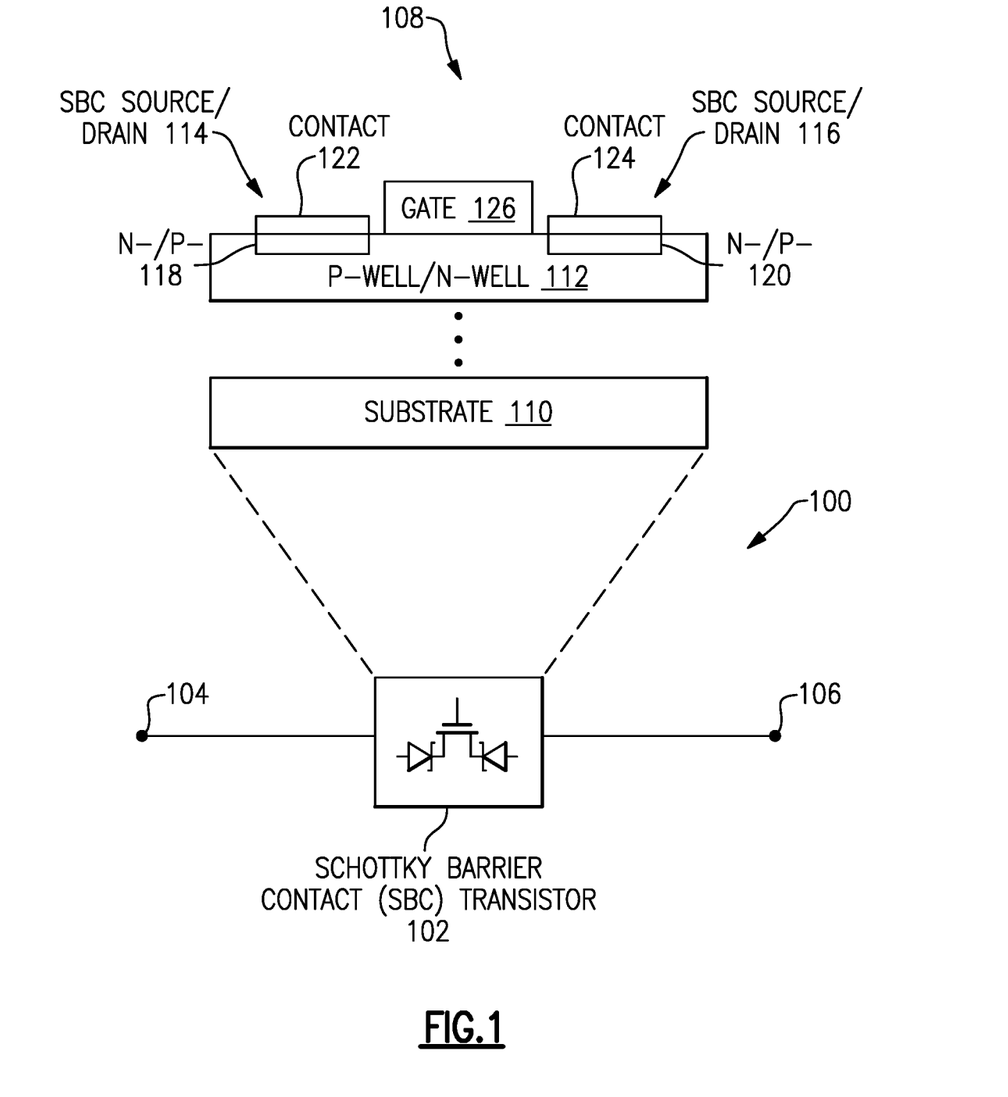
FIG. 1 illustrates an example switch having a Schottky barrier contact (SBC) transistor in accordance with one or more embodiments.

FIG. 1 illustrates an example switch 100 having a Schottky barrier contact (SBC) transistor 102. In particular, the SBC transistor 102 is electrically connected between an input node 104 and an output node 106. The SBC transistor 102 can be controlled to allow passage of a signal from the input node 104 to the output node 106. For example, when in an ON state, the SBC transistor 102 can pass a signal (e.g., a radio-frequency signal) received at the input node 104 to the output node 106. When in an OFF state, the SBC transistor 102 can prevent passage of a signal from the input node 104 to the output node 106. The input node 104, the SBC transistor 102, the output node 106, and/or conductive material used to connect the components can form a signal path.

As shown by a sectional view 108, the SBC transistor 102 can include a substrate 110 and a P-well or N-well 112 formed in the substrate 110 or another layer disposed between the substrate 110 and the P-well or N-well 112. In cases where an additional layer is included, the additional layer can include an insulator layer or another layer, as discussed in reference to FIGS. 2A and 2B. A source/drain 114/116 (sometimes referred to as the SBC source/drain 114/116) can be formed by (i) doping the P-well or N-well 112 to form regions 118 and 120 and (ii) forming contacts 122 and 124 on the regions 118 and 120, respectively. A gate 126 can also be formed on the P-well or N-well 112, so as to be positioned between the source and the drain.

In this example, the "N−" and "P−" of the regions 118 and 120 indicate that a concentration of a dopant in the regions 118 and 120 is classified as low doping or lightly doped, such as below a threshold. For instance, a dopant concentration for the regions 118 and 120 can be substantially less (e.g., by less than a threshold amount) than a dopant concentration of a region used for an ohmic contact. An ohmic contact is generally doped with a concentration that is classified as high doping or heavily doped (often represented as N+ or P+). In the example of FIG. 1, the regions 118 and 120 and the contacts 122 and 124 form Schottky barrier diodes, respectively. That is, the region 118 and the contact 122 form a first Schottky barrier diode, while the region 120 and the contact 124 form a second Schottky barrier diode.

The SBC transistor 102 can be implemented as a variety of types of transistors. For example, a transistor can include a field-effect transistor (FET) (e.g., N-type or P-type device), such as a junction FET (JFET), insulated gate FET (e.g., a metal-oxide-semiconductor FET (MOSFET), a complementary metal-oxide-semiconductor (CMOS), etc.), a silicon-on-insulator (SOI) FET, and so on. Further, a transistor can include a Bipolar junction transistor (BJT) (e.g., an NPN transistor, a PNP transistor, etc.), such as a heterojunction bipolar transistor (HBT), etc. For ease of illustration, many examples are shown with the SBC transistor 102 implemented as a FET, such as a p-type or n-type FET. However, other types of transistors can be implemented.

Figure 7:
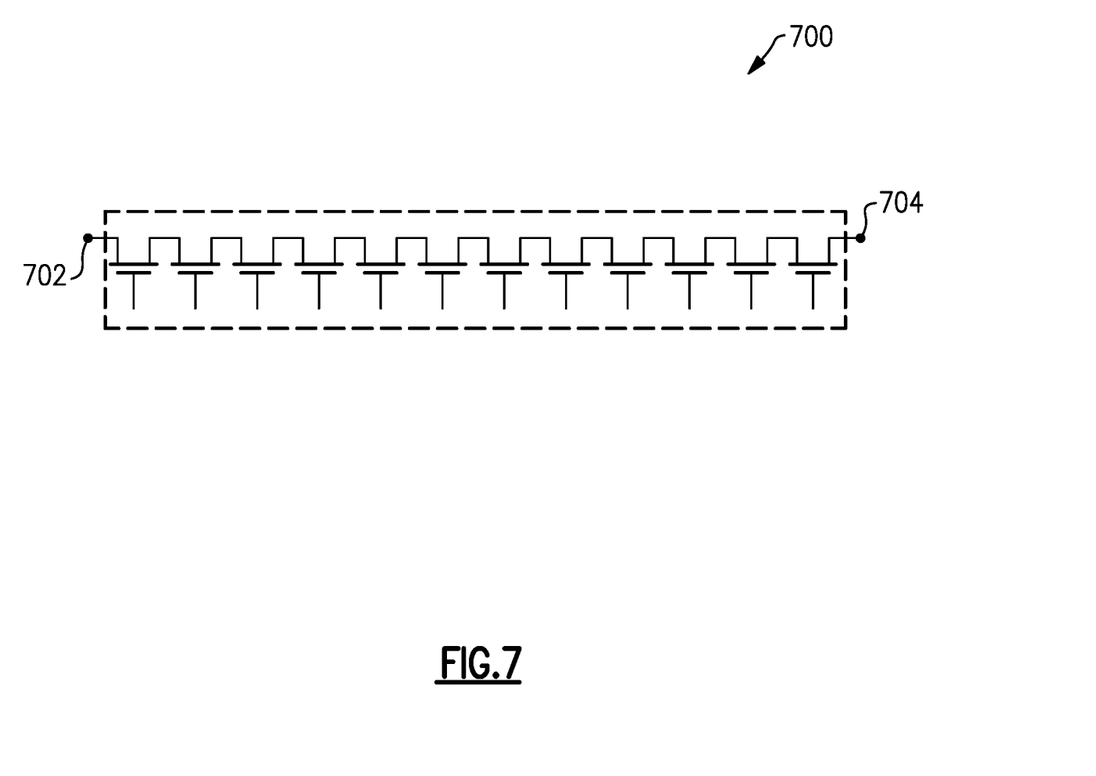
FIG. 7 illustrates an example transistor stack in accordance with one or more embodiments.

In examples, the SBC transistor 102 is implemented as a transistor stack. A transistor stack can include a plurality of transistors connected in series. A number of transistors in a stack can be scaled based on power requirements of a switch, such as to handle various power capabilities. An example implementation of a transistor stack is shown in FIG. 7. For ease of illustration, the SBC transistor 102 is shown in many figures with a single device. However, it should be understood that the illustrated single device can represent one or more devices.

In examples, a transistor of a switch or another component of a device in which the switch is implemented can have non-linear characteristics that contribute to the creation of distortion products. Distortion products can include harmonic distortion (HD) and/or intermodulation distortion (IMD). For instance, assume that an input signal with two frequency components ($f_1$ and $f_2$) is provided to a switch. The two frequency components can be separated by each other. Non-linearities in the switch can cause an output signal to include not only the original two frequency components, but additional frequency components at different frequencies, such as second-order harmonic distortion products (e.g., $2f_1$ and $2f_2$), second-order intermodulation products (e.g., $f_1+f_2$ and $f_2-f_1$), third-order harmonic distortion products (e.g., $3f_1$ and $3f_2$), third-order intermodulation products (e.g., $2f_1-f_2$ and $2f_2-f_1$), and so on.

In examples, second-order and third-order distortion products are of particular interest, since these distortion products are often relatively close to the original input frequency components. In general, as power levels decrease, the intermodulation distortion order number increases. To illustrate, when original frequency components $f_1$ and $f_2$ are relatively near each other in frequency (e.g., within a threshold amount), the third-order intermodulation products are also relatively nearby in frequency. This can make it difficult to filter out the third-order intermodulation products while retaining the original frequency components $f_1$ and $f_2$. Accordingly, it is valuable to reduce the generation of third-order harmonic and intermodulation products by reducing non-linearity characteristics of a device or switch rather than by attempting to remove the intermodulation products later. In examples, higher order products, such as fourth-order and fifth-order products, can also be of interest.

As such, the switch 100 discussed herein minimizes or compensates for non-linearities produced by the switch 100 and/or a device in which the switch 100 is implemented. For example, the switch 100 includes the SBC source/drain 114/116 having Schottky barrier diodes to minimize or compensate for distortion products, such as third-order intermodulation products, third-order harmonics, and so on.

Figure 2A:
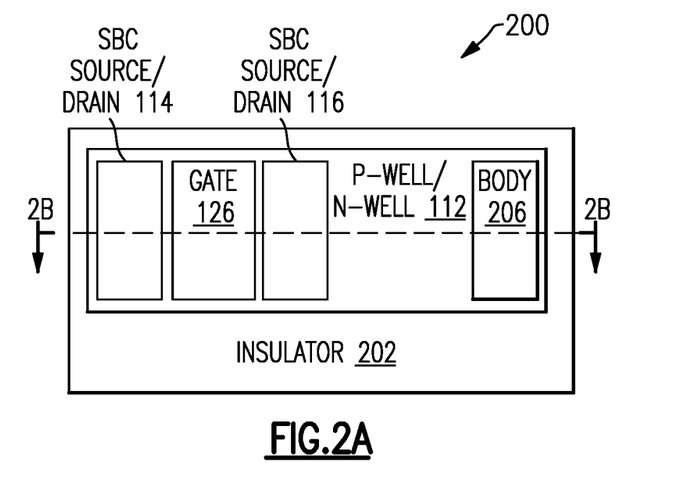
FIGS. 2A and 2B illustrate plan and side sectional views of an example SBC transistor formed using silicon-on-insulator (SOI) technology in accordance with one or more embodiments.
Figure 2B:
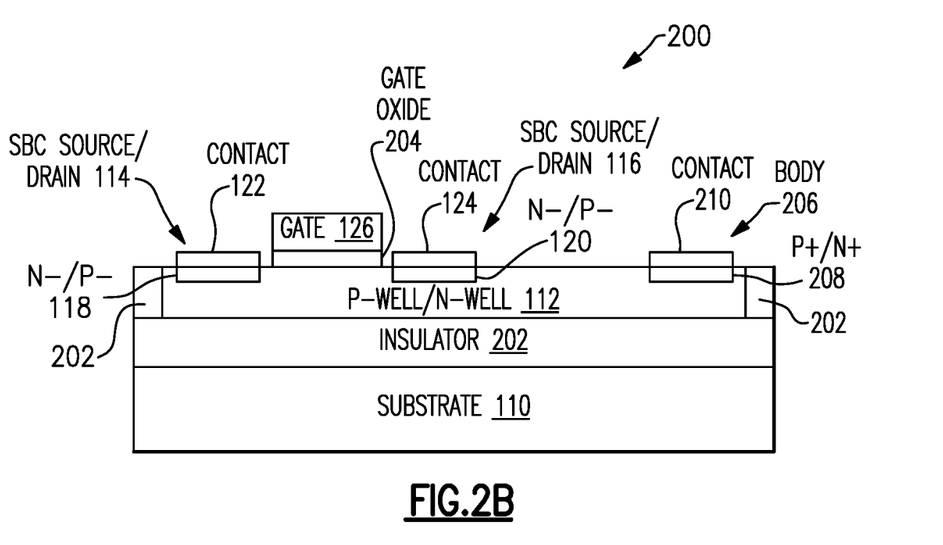

FIGS. 2A and 2B illustrate plan and side sectional views of an example SBC transistor 200 formed using silicon-on-insulator (SOI) technology. In examples, SOI technology can include a semiconductor substrate having an embedded layer of electrically insulating material, such as a buried oxide layer (also referred to as a BOX) beneath a silicon device layer. For example, a SOI substrate can include an oxide layer embedded below a silicon layer. Other insulating materials can also be used. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

In this example, the SBC transistor 200 is configured as a finger-based device where the source and drain are rectangular shaped (in a plan view) and a gate structure extends between the source and the drain like a rectangular shaped finger. Although illustrated as a finger-based device, the SBC transistor 200 can be configured as other types of devices shaped in different manners.

The SBC transistor 200 can include the substrate 110 (also referred to as the semiconductor substrate 110). The substrate 110 can include a P-type silicon wafer, an N-type silicon wafer, etc. An insulator layer 202 (also referred to as the BOX 202) can be formed on the semiconductor substrate 110. The insulator layer 202 can be formed from materials including, for example, silicon dioxide, sapphire, etc. A P-well or N-well 112 can be formed in the insulator layer 202 such that the exposed surface generally defines a rectangular region. The regions 118 and 120 can be N-doped or P-doped and can generally include exposed surfaces that define rectangles. The SBC source/drain 114/116 can be configured so that source and drain are positioned on either side of the gate 126.

As shown, the gate 126 can be formed on the P-well or N-well 112 so the gate 126 is positioned between the source and the drain. A gate oxide layer 204 can be formed between the gate 126 and the P-well or N-well 112. Here, the example gate 126 is depicted as having a rectangular shape that extends along with the source and the drain. A body contact 206 (sometimes referred to as the body 206) can also be formed by (i) doping the P-well or N-well 112 to form a region 208 and (ii) forming a contact 210 on the region 208. In this example, the "P+" and "N+" of the region 208 indicate that the region 208 is doped with a concentration that is classified as high doping or heavily doped.

The contact 122, the contact 124, and/or the contact 210 can be formed of a variety of metals, such as titanium, nickel, platinum, cobalt, any combination thereof, or any other metal. Further, the contact 122, the contact 124, and/or the contact 210 can be formed of doped silicon (e.g., highly doped silicon) or another material.

The SBC transistor 200 can be implemented as an N-channel or P-channel device. For example, when implemented as an N-channel device, the regions 118 and 120 of the SBC source/drain 114/116 can be N-regions, the P-well or N-well 112 can be a P-well, and the region 208 of the body 206 can be a P+ region. Alternatively, when implemented as a P-channel device, the regions 118 and 120 of the SBC source/drain 114/116 can be P− regions, the P-well or N-well 112 can be an N-well, and the region 208 of the body 206 can be an N+ region.

In some example transistors discussed herein, source and drain regions can be formed adjacent to the ends of their respective upper insulator layers. Further, the junctions between the body and the source/drain regions on the opposing sides of the body can extend substantially all the way down to the top of the buried insulator layer. Such a configuration can provide, for example, reduced source/drain junction capacitance. To form a body contact for such configuration, an additional gate region can be provided on the side so as to allow, for example, an isolated P+ region to contact a P-well.

Figure 3:
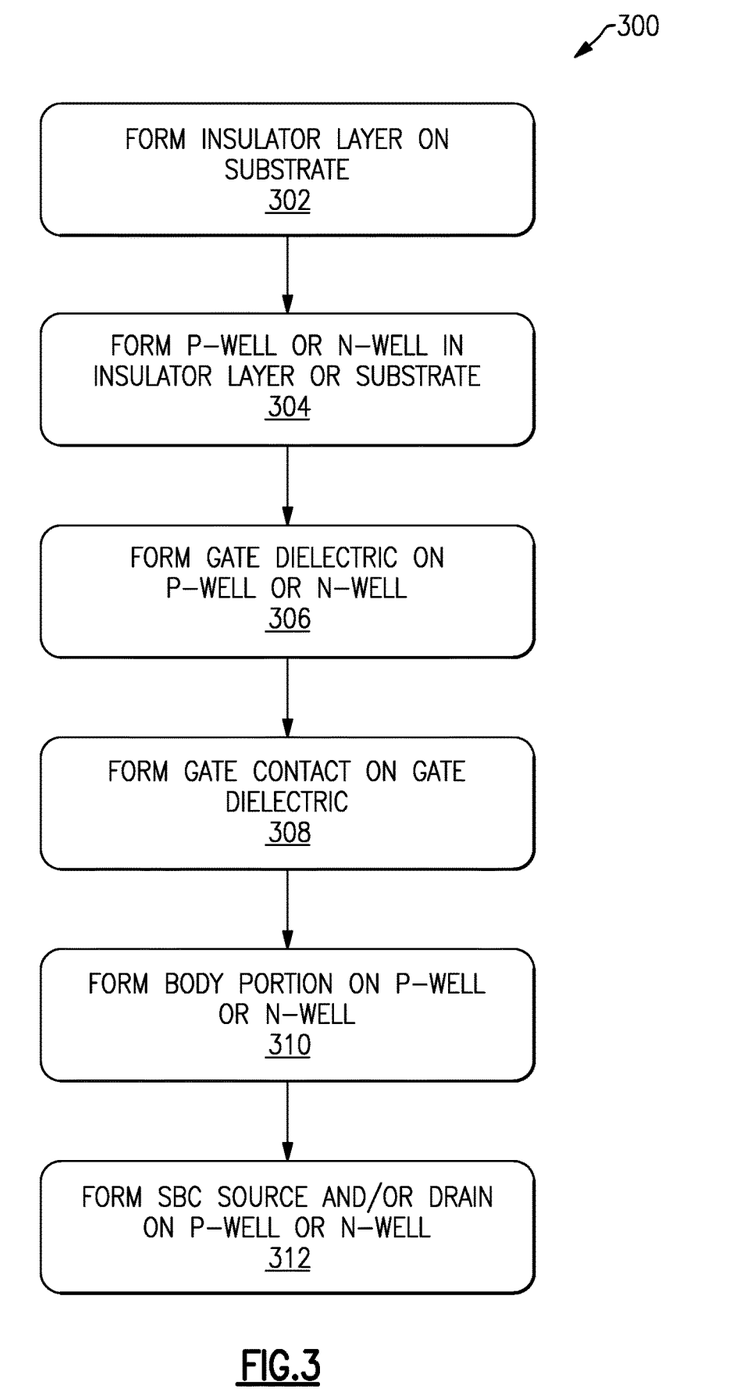
FIG. 3 illustrates an example process of forming an SBC transistor in accordance with one or more embodiments.

FIG. 3 illustrates an example process 300 of forming an SBC transistor. The process 300 can be part of or include a semiconductor device fabrication process that is performed, at least in part, by one or more systems having one or more hardware components.

At 302, an insulator layer is formed on a substrate. The substrate can include a P-type silicon wafer, an N-type silicon wafer, another semiconductor substrate, etc. The insulator layer can include silicon dioxide, sapphire, or another insulator.

At 304, a P-well or N-well is formed in the insulator layer or the substrate. For example, a region within the insulator layer can be P-doped or N-doped to form a P-well or N-well within the insulator layer.

At 306, a gate dielectric is formed on the P-well or N-well. For example, the gate dielectric can be formed of an insulating layer of silicon dioxide. The gate dielectric can comprise a gate oxide layer that separates a gate contact from the P-well or N-well.

At 308, a gate contact is formed on the gate dielectric. The gate contact (also referred to as the gate electrode, gate metal, or gate conductor) can be made of a conductive material, such as a highly doped silicon or a metal. The operations 306 and/or 308 can form a gate for the SBC transistor.

At 310, a body portion is formed on the P-well or N-well. For example, the body portion can be formed by P-doping or N-doping the P-well or N-well to form a doped region (e.g., P+ or N+) and forming a conductive layer on the doped region. The conductive layer can be made of a conductive material, such as highly doped silicon, a metal, etc.

At 312, an SBC source or drain is formed on the P-well or N-well. For example, an SBC source/drain can be formed by N-doping or P-doping the P-well or N-well to form a doped region (e.g., N- or P−) and forming a conductive layer on the doped region. The conductive layer can be made of a conductive material, such as highly doped silicon, a metal, etc.

Figure 4:
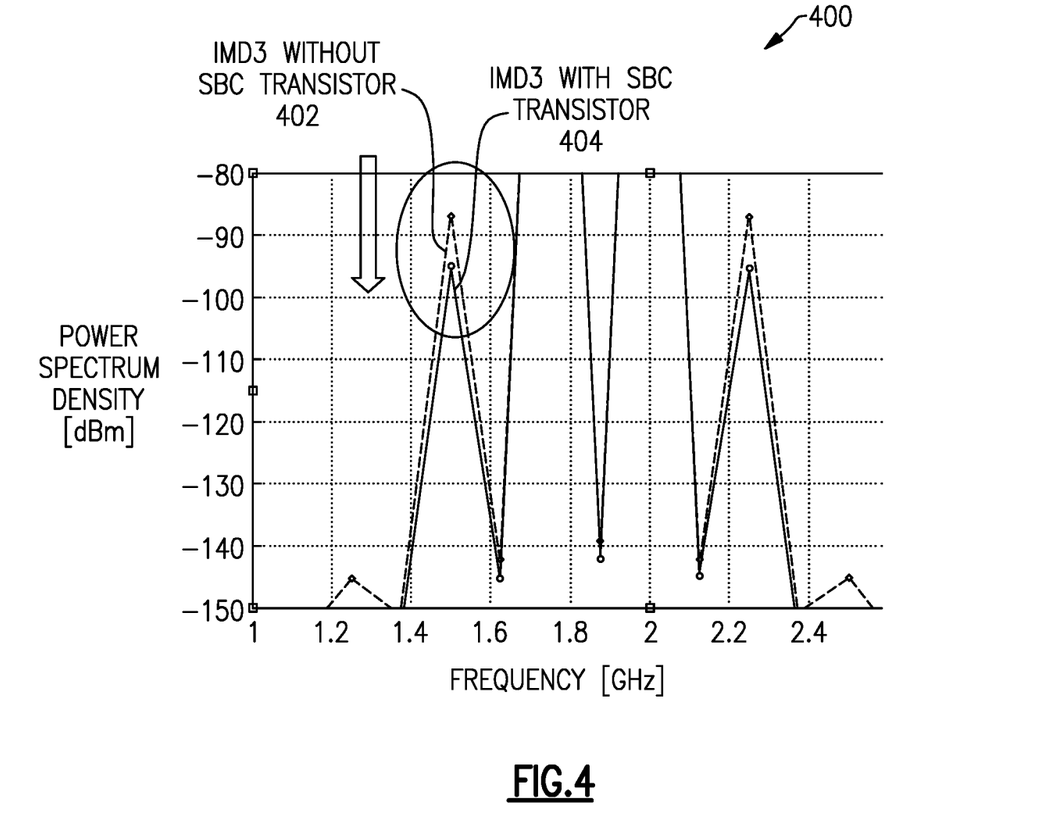
FIG. 4 illustrates an example frequency spectrum graph of output signals from different systems in accordance with one or more embodiments.

FIG. 4 illustrates an example frequency spectrum graph 400 of output signals from different systems. The graph 400 shows power spectrum density at a load in dBm with respect to frequency in GHz. In this example, an input signal with two frequency components at 1.75 GHz and 2 GHz is provided into a system, and power is detected. The input signal with frequency components is also referred to as fundamental signals.

As shown, the power of third-order intermodulation distortion (IMD3) 402 for an example system that does not include an SBC transistor (e.g., a switch with another type of transistor) is about −86 dBm. Further, the power of IMD3 404 for an example system that includes an SBC transistor (e.g., a switch with an SBC transistor) is about −95 dBm. As such, the system with the SBC transistor has about a 9 dBm reduction in power for IMD3 in comparison to the system without the SBC transistor. Although not illustrated, other harmonic/intermodulation distortion can also be reduced by implementing the system with the SBC transistor. Further, power for the output signals of the fundamental signals can remain about the same.

In examples, the SBC transistors discussed herein can reduce a signal strength of distortion products, such as third-order harmonic/intermodulation distortion products. Improved switching device intermodulation distortion performance can be desirable for wireless communication devices operating in various wireless communication standards, such as the LTE communication standard. In some applications, it can be desirable to improve linearity of switching devices operating in wireless communication devices that enable simultaneous transmission of data and voice communication. For example, improved intermodulation distortion performance in switching devices can be desirable for wireless communication devices operating in the LTE communication standard and performing simultaneous transmission of voice and data communication (e.g., SVLTE).

Figure 5A:
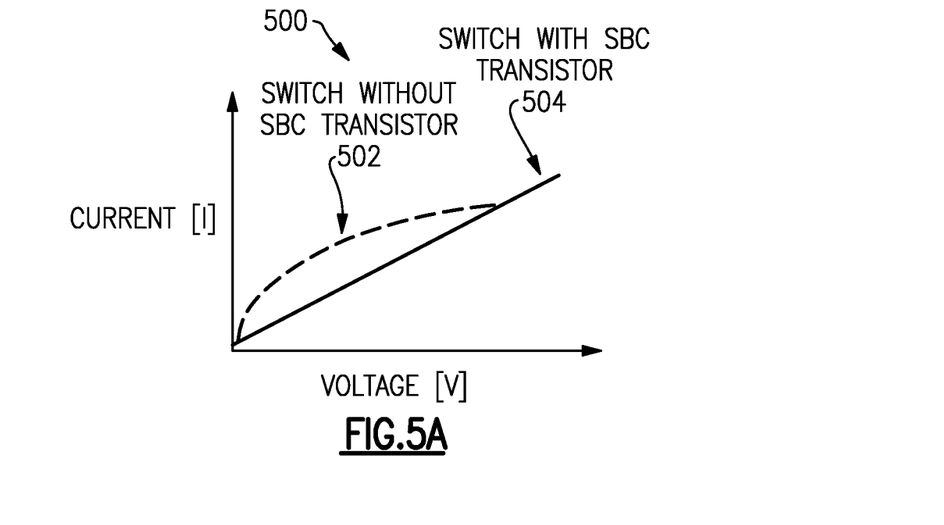
FIG. 5A illustrates an example I-V graph of signals from different systems in accordance with one or more embodiments.

FIG. 5A illustrates an example I-V graph 500 of signals from different systems. The graph 500 shows drain-source current with respect to voltage. As shown, a line 502 indicates the current and voltage for a switch without an SBC transistor. Further, a line 504 indicates the current and voltage for a switch with an SBC transistor. As illustrated, the switch with the SBC transistor produces substantially more linearity than the switch without the SBC transistor (e.g., the line 504 is substantially more linear than the line 502).

Figure 5B:
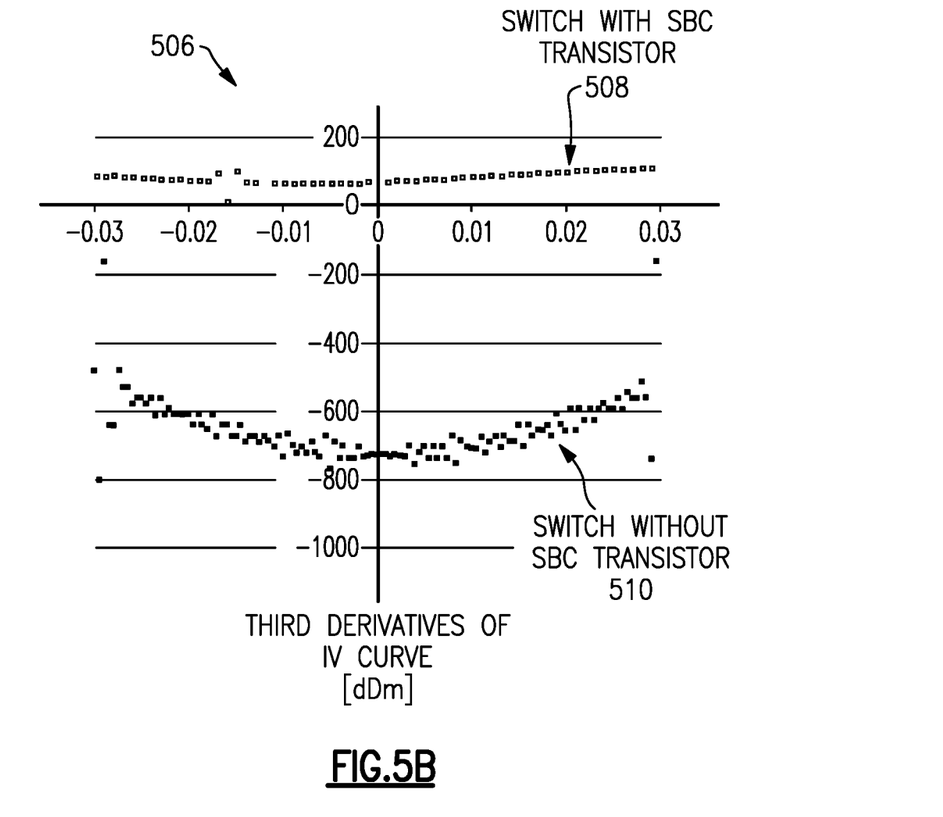
FIG. 5B illustrates an example graph of values for the third order derivatives of the I-V curves of FIG. 5A as a function of drain-source voltage (Vds) in accordance with one or more embodiments.

FIG. 5B illustrates an example graph 506 of values for the third order derivatives of the I-V curves of FIG. 5A as a function of drain-source voltage (Vds). The third order derivatives are related to IMD3. In particular, points 508 represent values for a switch with an SBC transistor, while points 510 represent values for a switch without an SBC transistor. As shown, the switch with the SBC transistor reduces the magnitude of third derivatives of the IV curve to under 100 dBm, which correlates to a reduction in the IMD3 products.

Figure 6:
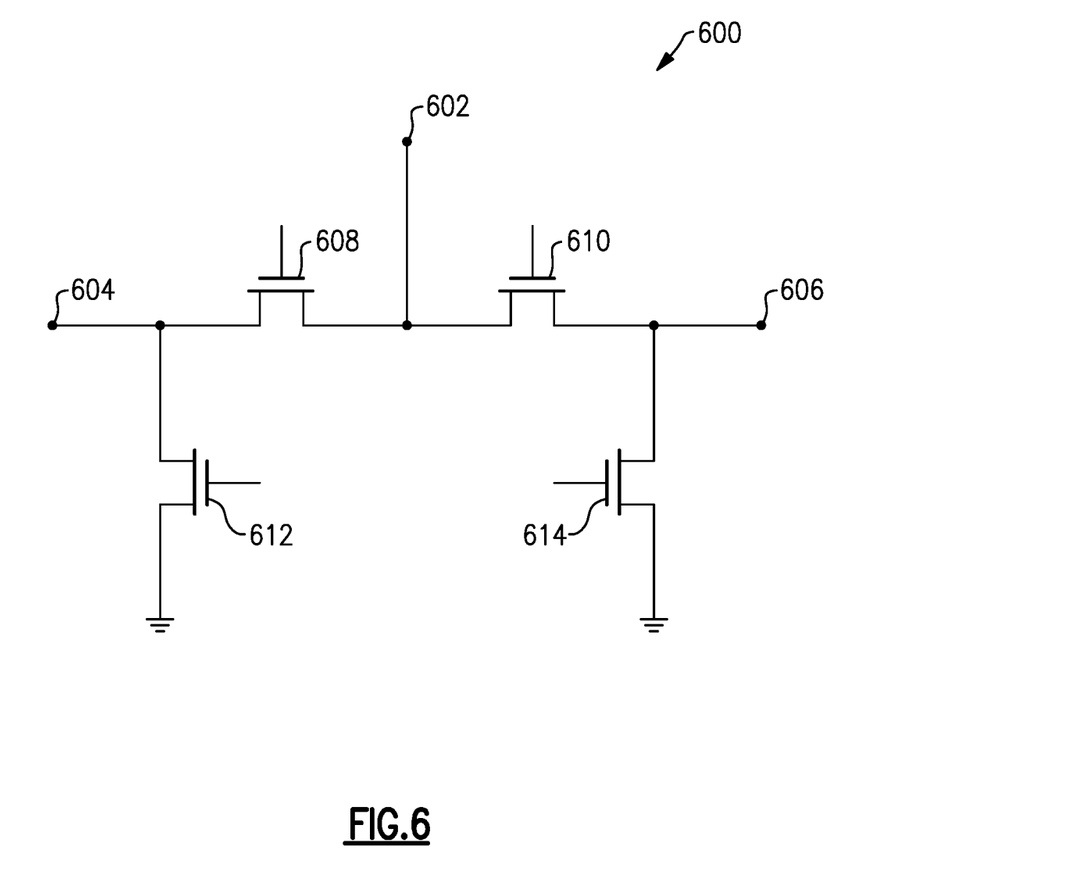
FIG. 6 illustrates a switch having multiple switch arms and multiple shunt arms in accordance with one or more embodiments.

FIG. 6 illustrates a switch 600 having multiple switch arms and multiple shunt arms. This example illustrates a single-pole-double-throw (SPDT) switch. However, any number of poles and/or throws can be implemented.

As shown, the switch 600 includes a single pole 602, a first throw 604, and a second throw 606. Each pole or throw can also be referred to as a port or node. The pole 602 is coupled to the first throw 604 via a transistor 608, while the pole 602 is coupled to the second throw 606 via a transistor 610. The first throw 604 is coupled to a ground via a transistor 612 to provide shunting capability for the first throw 604. Similarly, the second throw 606 is coupled to a ground via a transistor 614 to provide shunting capability for the second throw 606. The arm with the transistor 608 and the arm with the transistor 610 can each be referred to as a switch arm or series arm. Meanwhile, the arm with the transistor 612 and the arm with the transistor 614 can each be referred to as a shunt arm. Although illustrated with shunt arms, in some examples shunt arms are not included. In examples, the transistors 608, 610, 612, and/or 614 can be implemented as any of the SBC transistors discussed herein.

In an example operation, when the switch 600 is in a state where a signal is being passed between the pole 602 and the first throw 604, the transistor 608 can be in an ON state, and the transistor 610 between the pole 602 and the second throw 606 can be in an OFF state. Further, the transistor 612 can be in an OFF state so that the signal is not shunted to ground as the signal travels from the pole 602 to the first throw 604. The transistor 614 associated with the second throw 606 can be in an ON state so that any signals or noise arriving at the switch through the second throw 606 are shunted to the ground, thus reducing undesirable interference effects.

FIG. 7 illustrates an example transistor stack 700. The transistor stack 700 includes multiple transistors connected in series between a first node 702 and a second node 704. Although twelve transistors are shown in FIG. 7, any number of transistors can be used for a transistor stack. In examples, one or more of the SBC transistors discussed herein can be implemented as a transistor stack. For instance, the SBC transistor 102 of FIG. 1 can be implemented as a transistor stack, so that multiple transistors are positioned in series between the input node 104 and the output node 106, with one or more of the transistors being implemented as an SBC transistor.

Figure 8:
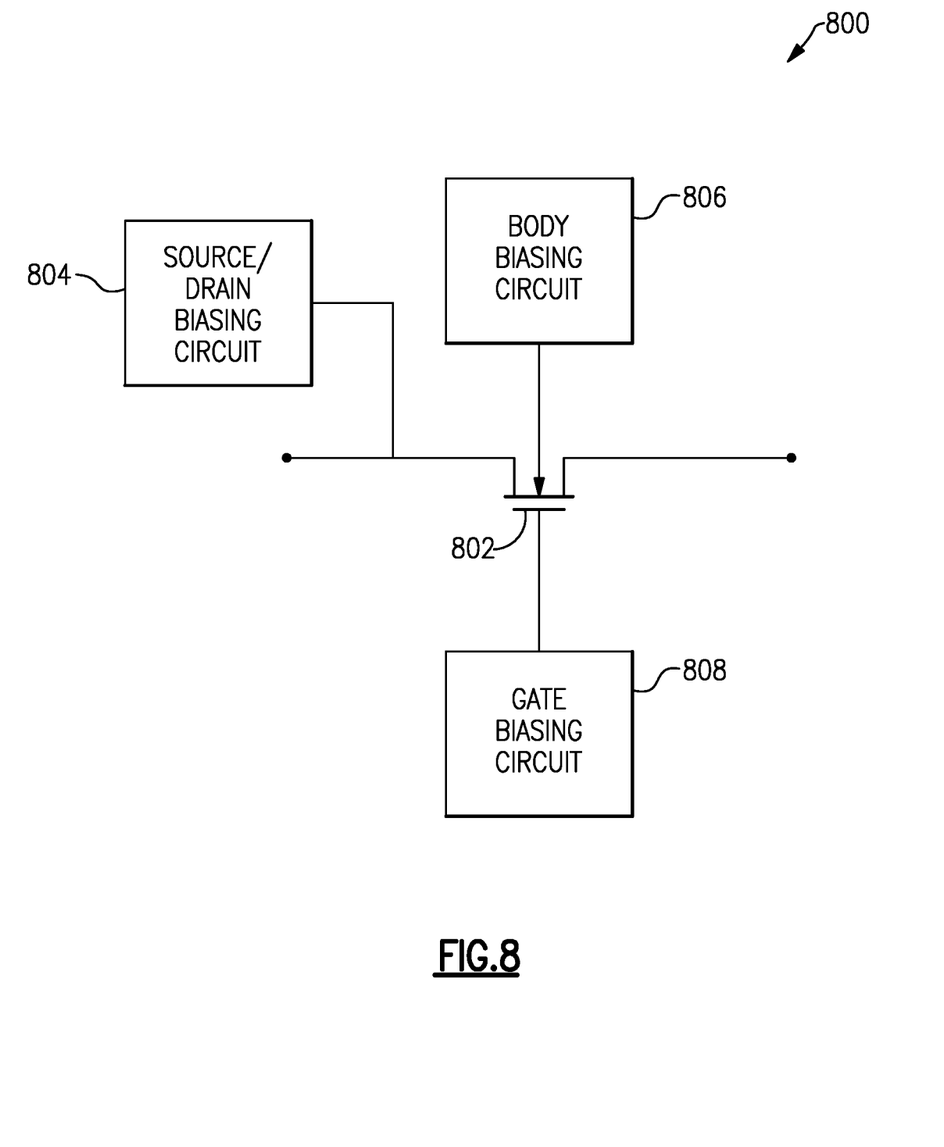
FIG. 8 illustrates example biasing circuitry for a transistor in accordance with one or more embodiments.

FIG. 8 illustrates example biasing circuitry 800 for a transistor 802. In this example, a source and/or drain of the transistor 802 is connected to a source/drain biasing circuit 804 that applies a biasing voltage to the source and/or drain of the transistor 802, a body of the transistor 802 is connected to a body biasing circuit 806 that applies a biasing voltage to the body of the transistor 802, and a gate of the transistor 802 is connected to a gate biasing circuit 808 that applies a biasing voltage to the gate of the transistor 802. The source/drain biasing circuit 804, the body biasing circuit 806, and/or the gate biasing circuit 808 can apply voltages that are more or less than a value to control the transistor 802 (e.g., place the transistor an in ON or OFF state).

In examples, the transistor 802 can be representative of any of the transistors discussed herein. That is, any of the transistors discussed herein can be biased in a similar manner as that of the example biasing circuitry 800 of the transistor 802. As such, although not illustrated in some cases, any of the transistors discussed herein can be connected to any number of biasing circuits to control the transistors.

Figure 9:
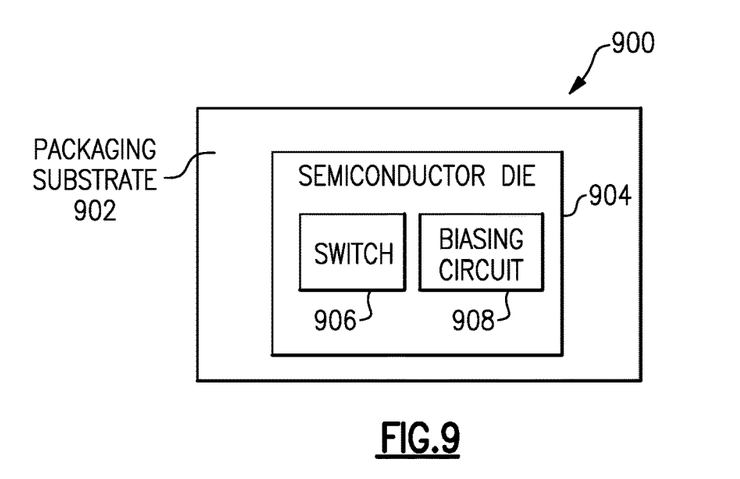
FIG. 9 illustrates an example radio-frequency module in accordance with one or more embodiments.

FIG. 9 illustrates an example radio-frequency module 900. The radio-frequency module 900 includes a packaging substrate 902, a semiconductor die 904 mounted on the packaging substrate 902, a switch 906 implemented on the semiconductor die 904, and a biasing circuit 908 implemented on the semiconductor die 904. Although illustrated on the semiconductor die 904, in some cases the biasing circuit 908 is implemented as part of the switch 906. In some examples, the radio-frequency module 900 can be a front-end module (FEM). The radio-frequency module 900 can facilitate, for example, multi-band, multi-mode operation of a radio-frequency device. The switch 906 can include any of the switches and/or SBC transistors discussed herein.

Figure 10:
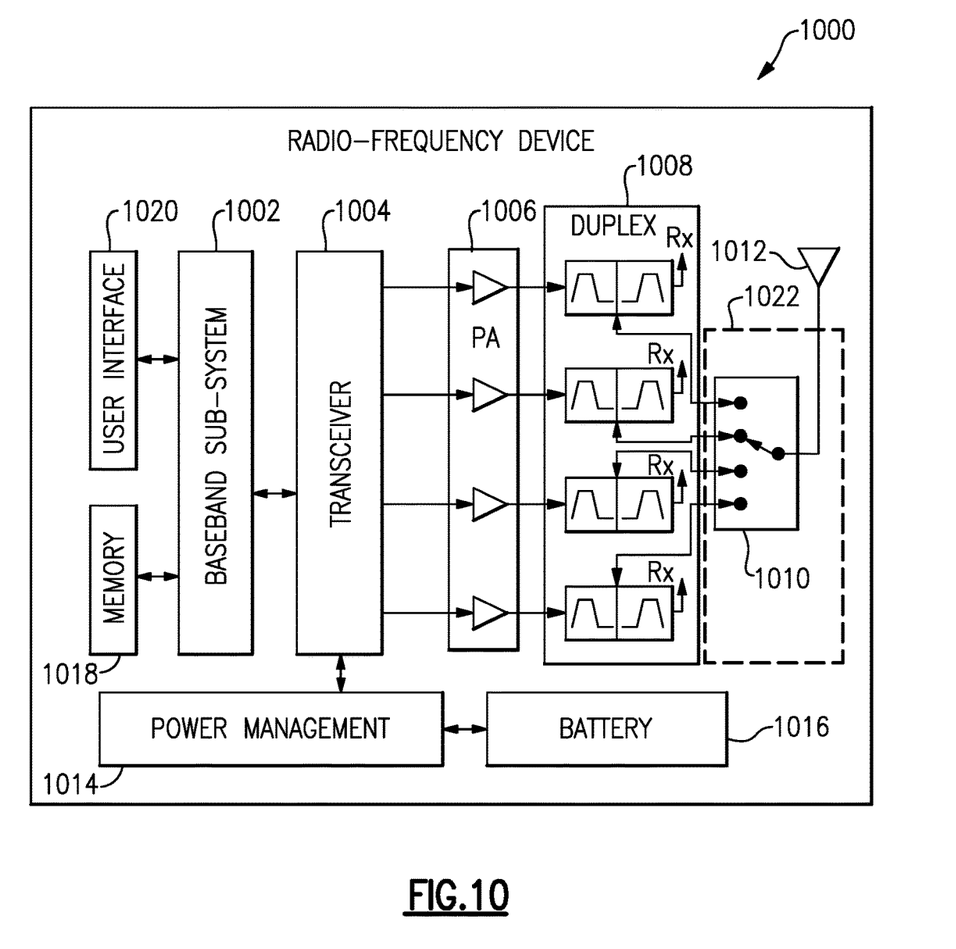
FIG. 10 illustrates an example radio-frequency device in accordance with one or more embodiments.

FIG. 10 illustrates an example radio-frequency device 1000. As shown, the radio-frequency device 1000 can include a baseband sub-system 1002, a transceiver 1004, a power amplifier (PA) module 1006, a duplexer 1008, a switch 1010, one or more antennas 1012, a power management system 1014, a battery 1016, a memory 1018, and a user interface 1020. The baseband sub-system 1002, the transceiver 1004, the PA module 1006, the duplexer 1008, the switch 1010, one or more antennas 1012, the power management system 1014, the battery 1016, the memory 1018, and/or the user interface 1020 can be in communication with each other.

The baseband sub-system 1002 can be connected to the user interface 1020 to facilitate various input and/or output of voice and/or data provided to and/or received from a user. The baseband sub-system 1002 can also be connected to the memory 1018 that is configured to store data and/or instructions to facilitate operation of the radio-frequency device 1000 and/or to provide storage of information for a user.

The transceiver 1004 can generate radio-frequency (RF) signals for transmission and/or process incoming RF signals received from the one or more antennas 1012. The transceiver 1004 can interact with the baseband sub-system 1002 that is configured to provide conversion between data and/or voice signals suitable for a user and/or RF signals suitable for the transceiver 1004. The transceiver 1004 can also be connected to the power management system 1014.

The PA module 1006 can include a plurality of PAs that can provide an amplified RF signal to the switch 1010 (e.g., via the duplexer 1008). The PA module 1006 can also receive an unamplified RF signal from the transceiver 1004. In examples, the duplexer 1008 can allow transmit and/or receive operations to be performed simultaneously using a common antenna. In FIG. 10, received signals are shown to be routed to "Rx" paths that can include, for example, a low-noise amplifier (LNA).

The switch 1010 can route an RF signal to and/or from the one or more antennas 1012. The switch 1010 can include any number of poles and/or throws. The switch 1010 can be implemented as any of the switches discussed herein. In examples, the switch 1010 is implemented on a module 1022. The module 1022 can include a packaging substrate configured to receive a plurality of components. Although one switch 1010 is illustrated in the example of FIG. 10, any number of switches can be implemented on the radio-frequency device 1000.

The one or more antennas 1012 can include antennas for transmitting and/or receiving signals associated with a wide variety of frequencies and communications standards. In examples, the one or more antennas 1012 support Multiple-Input Multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator. In examples, the one or more antennas 1012 can include a diversity antenna.

The power management system 1014 can be configured to manage power for operation of the radio-frequency device 1000. The power management system 1014 can provide power to any number of components of the radio-frequency device 1000. The power management system 1014 can receive a battery voltage from the battery 1016. The battery 1016 can be any suitable battery for use in the radio-frequency device 1000, including, for example, a lithium-ion battery.

The radio-frequency device 1000 can communicate using a wide variety of communications technologies, including, but not limited to, 2G, 3G, 4G (including Long Term Evolution (LTE), LTE-Advanced, and LTE-Advanced Pro), 5G NR, Wireless Local Area Network (WLAN) (for instance, Wi-Fi), Wireless Personal Area Network (WPAN) (for instance, Bluetooth and ZigBee), Wireless Metropolitan Area Network (WMAN) (for instance, WiMax), and/or satellite-based radio navigation systems (for instance, Global Positioning System (GPS) technologies).

The radio-frequency device 1000 can operate with beamforming in certain implementations. For example, the radio-frequency device 1000 can include phase shifters having variable phase controlled by the transceiver 1004. Additionally, the phase shifters are controlled to provide beam formation and directivity for transmission and/or reception of signals using the one or more antennas 1012. For example, in the context of signal transmission, the phases of the transmit signals provided to the one or more antennas 1012 are controlled such that radiated signals from the one or more antennas 1012 combine using constructive and destructive interference to generate an aggregate transmit signal exhibiting beam-like qualities with more signal strength propagating in a given direction. In the context of signal reception, the phases are controlled such that more signal energy is received when the signal is arriving to the one or more antennas 1012 from a particular direction. In certain implementations, the one or more antennas 1012 include one or more arrays of antenna elements to enhance beamforming.

In examples, the radio-frequency device 1000 supports carrier aggregation, thereby providing flexibility to increase peak data rates. Carrier aggregation can be used for both Frequency Division Duplexing (FDD) and Time Division Duplexing (TDD), and can be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The radio-frequency device 1000 can include a wide variety of devices that are configured to communicate wirelessly. For example, the radio-frequency device 1000 can include a cellular phone, a smart-phone, a hand-held wireless device with or without phone functionality, a wireless tablet, a smart appliance, a smart vehicle, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wearable device (e.g., a watch), a clock, etc.

The detailed description is set forth with reference to the accompanying figures. In the figures, the left-most digit(s) of a reference number identifies the figure in which the reference number first appears. The use of the same reference numbers in different figures indicates similar or identical items.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Further, the word "connected" can refer to two or more elements that are either directly connected or connected by way of one or more intermediate elements. Components discussed herein can be coupled or connected in a variety of manners, such as through a conductive material. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above description of embodiments of the disclosure is not intended to be exhaustive or to limit the disclosure to the precise form disclosed above. While specific embodiments, and examples, are described above for illustrative purposes, various equivalent modifications are possible within the scope of the disclosure, as those skilled in the relevant art will recognize. For example, while processes or blocks may be presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The features described herein can be applied to other systems, not necessarily the system described above. The elements and acts of the various embodiments described above can be combined to provide further embodiments.

While some embodiments have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. Claims and their equivalents are intended to cover such forms or modifications as would fall within the scope and spirit of the disclosure.

What is claimed is:

1. A method of fabricating a transistor, the method comprising:
   forming a p-well or an n-well in a substrate;
   forming a gate for the transistor;
   doping a first region within the p-well or the n-well with a concentration that is below a threshold to form a source for the transistor;
   doping a second region within the p-well or the n-well with the concentration to form a drain for the transistor, at least a portion of the p-well or the n-well being disposed between the source and the drain of the transistor; and
   forming a first contact on the first region and a second contact on the second region.

2. The method of claim 1 wherein the first contact on the first region forms a non-ohmic contact.

3. The method of claim 1 wherein the first region and the first contact form a non-ohmic junction.

4. The method of claim 1 wherein the concentration is less than a doping concentration associated with an ohmic contact.

5. The method of claim 1 wherein the concentration is less than, by a least a threshold amount, a doping concentration of an ohmic contact.

6. The method of claim 1 further comprising forming an insulator layer on the substrate to form the transistor as a Silicon-on-Insulator (SOI) device.

7. The method of claim 1 wherein the first region and first contact form the source for the transistor and the second region and second contact form the drain for the transistor.

8. The method of claim 1 wherein the concentration is classified as low doping.

9. A radio-frequency switch comprising:
an input node;
an output node; and
a transistor connected between the input node and the output node, the transistor being configured to control passage of a radio-frequency signal from the input node to the output node, the transistor including a p-well or an n-well in a substrate, a first region within the p-well or the n-well, a second region within the p-well or the n-well, a first contact disposed on the first region, and a second contact disposed on the second region, the first region and the second region being doped with a concentration below a threshold, the first region forming at least a portion of a source for the transistor and the second region forming at least a portion of a drain for the transistor, at least a portion of the p-well or the n-well being disposed between the first region and the second region.

10. The radio-frequency switch of claim 9 wherein the first region and first contact form a Schottky barrier.

11. The radio-frequency switch of claim 10 wherein the Schottky barrier is configured to compensate for third order distortion.

12. The radio-frequency switch of claim 9 wherein the transistor is implemented as a Silicon-on-Insulator (SOI) device.

13. The radio-frequency switch of claim 9 wherein the first and second contacts are each a metal contact.

14. The radio-frequency switch of claim 9 wherein the first contact disposed on the first region forms a non-ohmic contact.

15. The radio-frequency switch of claim 9 wherein the first region and the first contact form a non-ohmic junction.

16. The radio-frequency switch of claim 9 wherein the concentration is less than a doping concentration associated with an ohmic contact.

17. A transistor comprising:
a substrate;
a p-well or an n-well formed in the substrate;
a first region in the p-well or the n-well that is doped with a concentration below a threshold, the first region forming at least a portion of a source for the transistor;
a second region in the p-well or the n-well that is doped with the concentration, at least a portion of the p-well or the n-well being disposed between the first region and the second region, the second region forming at least a portion of a drain for the transistor;
a first contact disposed on the first region; and
a second contact disposed on the second region.

18. The transistor of claim 17 wherein the concentration is less than, by a least a threshold amount, a doping concentration of an ohmic contact.

19. The transistor of claim 17 wherein the first region and first contact form a Schottky barrier.

20. A radio-frequency device comprising:
a transceiver configured to generate a radio-frequency signal;
a power amplifier coupled to the transceiver and configured to generate an amplified radio-frequency signal; and
a radio-frequency switch including the transistor of claim 17, the radio-frequency switch being coupled to the power amplifier and being configured to selectively route the amplified radio-frequency signal.

\* \* \* \* \*